(12) United States Patent
Kaneko et al.

(10) Patent No.: US 7,919,818 B2
(45) Date of Patent: Apr. 5, 2011

(54) SEMICONDUCTOR DEVICE

(75) Inventors: Saichiro Kaneko, Kyoto (JP); Takashi Kunimatsu, Shiga (JP)

(73) Assignee: Panasonic Corporation, Osaka (JP)

( * ) Notice: Subject to any disclaimer, the term of this patent is extended or adjusted under 35 U.S.C. 154(b) by 118 days.

(21) Appl. No.: 11/956,715

(22) Filed: Dec. 14, 2007

(65) Prior Publication Data

US 2008/0203533 A1    Aug. 28, 2008

(30) Foreign Application Priority Data

Feb. 22, 2007    (JP) .................. 2007-041902

(51) Int. Cl.
*H01L 21/331* (2006.01)
(52) U.S. Cl. ............ 257/359; 257/360; 257/256
(58) Field of Classification Search ........... 257/E21.382, 257/566, 341, 133, 173, 174, 328, 355–363, 257/487–496, 546; 438/281
See application file for complete search history.

(56) References Cited

U.S. PATENT DOCUMENTS

| | | | |
|---|---|---|---|
| 6,268,990 B1 * | 7/2001 | Ogura et al. | 361/91.7 |
| 6,333,604 B1 * | 12/2001 | Robb | 315/209 R |
| 6,680,513 B2 * | 1/2004 | Tomomatsu | 257/359 |
| 2001/0042886 A1 * | 11/2001 | Yoshida et al. | 257/341 |
| 2008/0203533 A1 * | 8/2008 | Kaneko et al. | 257/566 |

FOREIGN PATENT DOCUMENTS

JP          09-260592        10/1997

OTHER PUBLICATIONS

Kaneko, et al., "A 800 V Hybrid IGBT Having a High-Speed Internal Diode for Power-Supply Applications," Proceedings of the 19th International Symposium on Power Semiconductor Devices & ICs, May 27-30, 2007, Jeju, Korea.

* cited by examiner

*Primary Examiner* — Zandra Smith
*Assistant Examiner* — Telly D Green
(74) *Attorney, Agent, or Firm* — McDermott Will & Emery LLP

(57) ABSTRACT

A semiconductor device includes a principal IGBT controllable in accordance with a gate voltage applied to a gate electrode thereof, a current detecting IGBT connected to the principal IGBT in parallel and a current detecting part including a detecting resistor capable of detecting a current passing through the current detecting IGBT. The base region of the current detecting IGBT and the emitter region of the principal IGBT are electrically connected to each other, and the emitter region of the current detecting IGBT and the emitter region of the principal IGBT are electrically connected to each other through the detecting resistor.

11 Claims, 5 Drawing Sheets

SEMICONDUCTOR DEVICE

BACKGROUND OF THE INVENTION

The present invention relates to the structure of a protection circuit for a semiconductor device, and more particularly, it relates to an overcurrent protection circuit, used in a semiconductor device including an insulated gate switching element, for protecting the switching element from an overcurrent.

FIG. 7 shows the general cross-sectional structure of a lateral insulated gate bipolar transistor (hereinafter referred to as the IGBT). In the lateral IGBT 51 shown in FIG. 7, a $P^-$-type base region 205 is formed in a surface portion of an $N^-$-type semiconductor substrate 201. An $N^+$-type emitter region 206 is formed in a surface portion of the base region 205. Also, a gate insulating film 203 is formed over the base region 205 so as to extend from a portion on the emitter region 206 to a portion on the semiconductor substrate 201, and a gate electrode 204 is formed on the gate insulating film 203. Furthermore, a P-type collector region 202 is formed in another surface portion of the semiconductor substrate 201 to be spaced from the base region 205.

Moreover, a collector terminal P1' electrically connected to the collector region 202, a gate terminal P2' electrically connected to the gate electrode 204 and an emitter terminal P3' electrically connected to the emitter region 206 are formed above the semiconductor substrate 201.

The lateral IGBT 51 of FIG. 7 is turned on when a forward bias voltage is applied between the gate terminal P2' and the emitter terminal P3' with a side of the collector terminal P1' set to high potential. Alternatively, it is turned off when a zero bias voltage or a backward bias voltage is applied between the gate terminal P2' and the emitter terminal P3'. Thus, the lateral IGBT 51 has a switching characteristic that it is turned on/off in accordance with a gate voltage applied to the gate electrode 204.

A semiconductor device including such a lateral IGBT 51 is occasionally used with an inductive load connected between the collector terminal P1' of the lateral IGBT 51 and a power supply. If an accident happens in such a case, the inductive load is short-circuited, and hence, a current not less than several times of rated current passes through the lateral IGBT 51. When the load is thus short-circuited, such an overcurrent should be detected so as to interrupt the gate voltage or the collector voltage because otherwise the lateral IGBT 51 may be thermally broken through temperature increase.

Therefore, a semiconductor device having an overcurrent protection function for the lateral IGBT 51 shown in FIG. 8 (see, for example, Japanese Laid-Open Patent Publication No. 09-260592) has been proposed. The semiconductor device 50 of FIG. 8 includes the lateral IGBT 51 as a principal switching element controllable in accordance with a gate voltage, and further includes a current detecting lateral IGBT 52 connected to the lateral IGBT 51 in parallel. At this point, an emitter region of the current detecting lateral IGBT 52 is electrically connected to a sense resistor 54 working as a current detecting resistor. Also, a current detecting circuit 57 electrically connected to the current detecting lateral IGBT 52 includes a voltage comparator 56, and a reference voltage circuit 55 and the sense resistor 54 both connected to the voltage comparator 56.

In the semiconductor device 50 of FIG. 8, a current 59 passing through the current detecting lateral IGBT 52 flows through the sense resistor 54 to the emitter terminal P3'. At this point, a voltage generated between both ends of the sense resistor 54 and a voltage generated by the reference voltage circuit 55 are compared with each other by the voltage comparator 56, so that the current 58 passing through the lateral IGBT 51 corresponding to the principal switching element can be controlled on the basis of the thus obtained voltage difference.

SUMMARY OF THE INVENTION

The conventional semiconductor device 50 having the overcurrent protection function for the lateral IGBT 51 has, however, the following problem:

When the voltage generated between both ends of the sense resistor 54 is increased, the potential of the emitter region of the current detecting lateral IGBT 52 is increased, and hence, a current is difficult to pass through the current detecting lateral IGBT 52. As a result, the overcurrent protection function cannot be normally exhibited. Therefore, it is necessary to suppress the voltage generated between the both ends of the sense resistor 54 to approximately 0.3 V at most.

At this point, when a ratio between the current 59 passing through the sense resistor 54 and the current 58 passing through the lateral IGBT 51 (the current 58/the current 59) is designated as a sense ratio, the sense ratio of the conventional semiconductor device 50 is as small as approximately 300. Therefore, for exhibiting the overcurrent protection function when the current 58 has a value of, for example, 6 A, the amplitude of the current 59 flowing in this case is approximately 20 mA. Accordingly, in order to suppress the voltage generated between the both ends of the sense resistor 54 to approximately 0.3 V or less, the resistance value of the sense resistor 54 should be as small as approximately 15Ω or less. When the sense resistor 54 is formed so as to attain a resistance value as small as approximately 15Ω or less, however, the fabrication variation in the resistance value is so increased that the current value at which the overcurrent protection function is exhibited (namely, the value of the current 58) is also largely varied.

On the other hand, in order to set the resistance value of the sense resistor 54 to a large value to some extent, the sense ratio is increased, and for this purpose, it is necessary to reduce the value of the current 59 passing through the sense resistor 54 by reducing the size of the current detecting lateral IGBT 52. When the size of the current detecting lateral IGBT 52 is reduced, however, the value of the current 59 passing through the sense resistor 54 is largely varied, resulting in largely varying the current value at which the overcurrent protection function is exhibited (namely, the value of the current 58).

As described above, since the sense ratio cannot be sufficiently increased in the conventional semiconductor device 50 having the overcurrent protection function, the resistance value of the sense resistor 54 and the size of the current detecting lateral IGBT 52 are unavoidably designed to be small. As a result, the current value at which the overcurrent protection function is exhibited is disadvantageously largely varied.

In consideration of this conventional disadvantage, an object of the invention is, in a semiconductor device having the overcurrent protection function for a lateral IGBT, increasing a ratio between a current passing through a sense resistor and a current passing through a principal switching element so as to reduce the variation in the current value at which the overcurrent protection function is exhibited.

In order to achieve the object, the semiconductor device of this invention includes a principal IGBT controllable in accordance with a gate voltage applied to a gate electrode thereof; a current detecting IGBT connected to the principal IGBT in parallel; and current detecting means including a detecting resistor capable of detecting a current passing through the current detecting IGBT, and the principal IGBT includes a first base region and a first emitter region formed in a surface portion of the first base region, the current detecting IGBT includes a second base region and a second emitter region formed in a surface portion of the second base region, the second base region of the current detecting IGBT is electrically connected to the first emitter region of the principal IGBT, and the second emitter region of the current detecting IGBT is electrically connected to the first emitter region of the principal IGBT through the detecting resistor.

In the semiconductor device of the invention, the principal IGBT and the current detecting IGBT may be formed on one semiconductor substrate.

In the semiconductor device of the invention, the principal IGBT and the current detecting IGBT may be lateral elements.

According to the present invention, in the semiconductor device having an overcurrent protection function for a principal IGBT, a ratio between a current passing through a detecting resistor and a current passing through the principal IGBT, namely, a sense ratio, can be increased by twice or more as compared with that obtained in a conventional semiconductor device. Accordingly, since the resistance value of the detecting resistor and the size of a current detecting IGBT can be designed to be larger, variation in the current value at which the overcurrent protection function is exhibited can be reduced.

Also, in the semiconductor device of this invention, when the principal IGBT and the current detecting IGBT are formed on one and the same semiconductor substrate, a structure in which the base region of the current detecting IGBT and the emitter region of the principal IGBT are electrically connected to each other can be easily obtained as compared with the case where these IGBTs are not formed on the same substrate.

Moreover, in the semiconductor device of this invention, when the principal IGBT and the current detecting lateral IGBT are both lateral elements, the degree of freedom in the layout of electrodes and interconnects is higher than in a vertical IGBT having a surface covered with an emitter electrode. Therefore, the structure in which the base region of the current detecting IGBT and the emitter region of the principal IGBT are electrically connected to each other can be easily obtained.

As described so far, according to the semiconductor device of this invention, the ratio between a current passing through the detecting resistor and a current passing through the lateral IGBT corresponding to the principal switching element can be increased by twice or more as compared with that obtained in a conventional semiconductor device. Accordingly, the resistance value of the detecting resistor and the size of the current detecting IGBT can be designed to be larger, and hence, the variation in the current value at which the overcurrent protection function is exhibited can be reduced. Thus, the present invention is useful for an insulated gate switching element including an overcurrent protection circuit.

DETAILED DESCRIPTION OF THE INVENTION

A semiconductor device according to a preferred embodiment of the invention will now be described with reference to the accompanying drawings.

Figure 1:
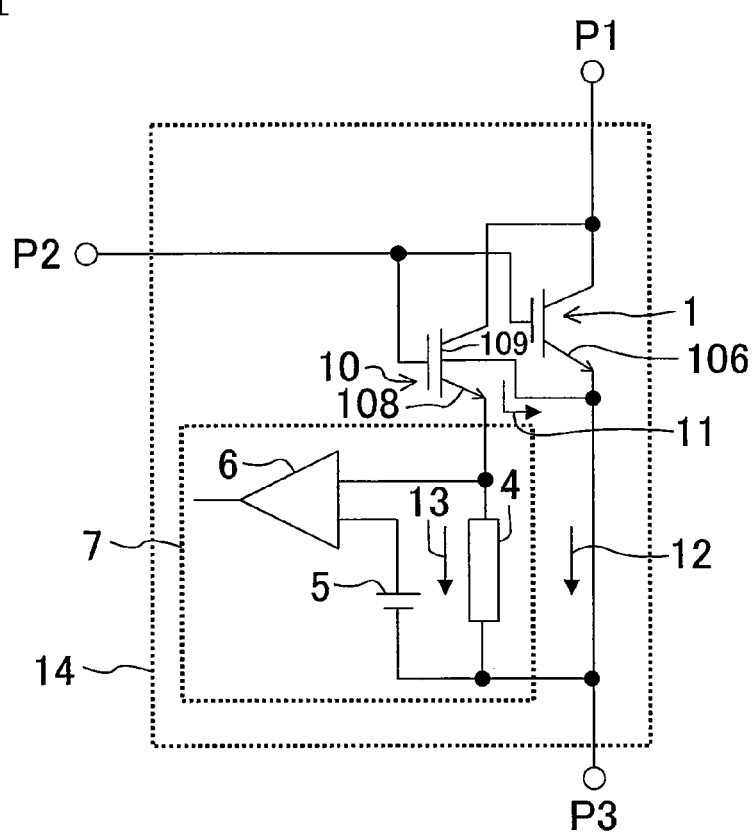
FIG. 1 is a circuit diagram for showing the configuration of a semiconductor device according to an embodiment of the invention.

FIG. 1 shows the rough circuit configuration of a semiconductor device of this embodiment, and more specifically, a semiconductor device having an overcurrent protection function for a lateral IGBT.

The semiconductor device 14 of FIG. 1 includes a lateral IGBT 1, that is, a principal switching element controllable in accordance with a gate voltage, and also includes a current detecting lateral IGBT 10 connected to the lateral IGBT 1 in parallel. Collector regions and gate electrodes of the lateral IGBT 1 and the current detecting lateral IGBT 10 are respectively electrically connected to a collector terminal P1 and a gate terminal P2. An emitter region 106 of the lateral IGBT 1 is electrically connected to an emitter terminal P3. An emitter region 108 of the current detecting lateral IGBT 10 is electrically connected to a sense resistor 4 working as a current detecting resistor and is also electrically connected to the emitter region 106 of the lateral IGBT 1, namely, the emitter terminal P3, through the sense resistor 4. A current detecting circuit 7 electrically connected to the current detecting lateral IGBT 10 includes a voltage comparator 6, and a reference voltage circuit 5 and the sense resistor 4 both connected to the voltage comparator 6.

As a remarkable characteristic of the semiconductor device 14 of this embodiment, a base region 109 of the current detecting lateral IGBT 10 and the emitter region 106 of the lateral IGBT 1 corresponding to the principal switching element are electrically connected to each other. Therefore, a hole current of a current passing through the current detecting lateral IGBT 10 flows from the base region 109 through the emitter region 106 of the lateral IGBT 1 to the emitter terminal P3 as a current 11. On the other hand, merely an electron current of the current passing through the current detecting lateral IGBT 10 flows through the sense resistor 4 to the emitter terminal P3 as a current (sense current) 13. At this point, a voltage generated between both ends of the sense resistor 4 and a voltage generated by the reference voltage circuit 5 are compared with each other by the voltage comparator 6, so that a current (collector current) 12 passing through the lateral IGBT 1 corresponding to the principal switching element can be controlled on the basis of a voltage difference therebetween.

Figure 8:
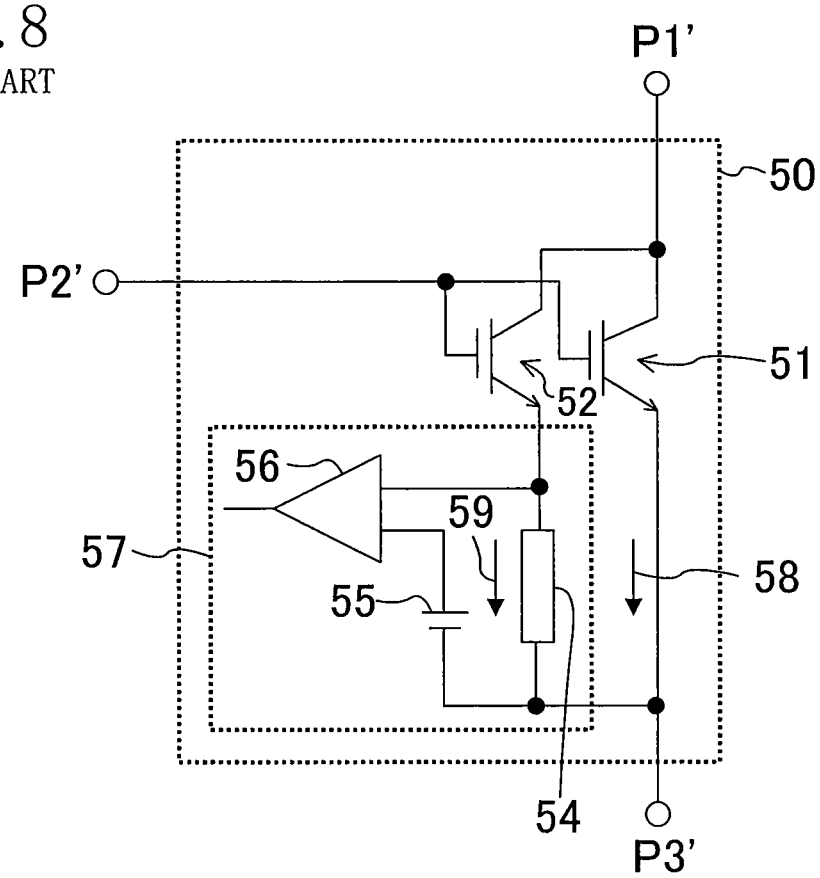
FIG. 8 is a circuit diagram for showing the configuration of a conventional semiconductor device including an overcurrent protection circuit for a lateral IGBT.

In this manner, in the semiconductor device 14 of this embodiment, the hole current (the current 11) of the current passing through the current detecting lateral IGBT 10 10 does not pass through the sense resistor 4, and hence, the current 13 passing through the sense resistor 4 is reduced correspondingly to the hole current. Accordingly, when a ratio between the current 13 passing through the sense resistor 4 and the current 12 passing through the lateral IGBT 1 is designated as a sense ratio, the sense ratio can be increased in the semiconductor device 14 of this embodiment than in the conventional semiconductor device 50 shown in FIG. 8.

In an experiment actually made by the present inventors, under conditions where the sense ratio is approximately 300 in the conventional semiconductor device 50, a sense ratio obtained with the base region of the current detecting IGBT and the emitter region of the IGBT corresponding to the principal switching element electrically connected to each other as in the semiconductor device 14 of this embodiment is approximately 600. Thus, the sense ratio can be substantially doubled as compared with that obtained in the conventional semiconductor device 50.

In this manner, in the semiconductor device 14 having the overcurrent protection function for the lateral IGBT 1 corresponding to the principal switching element according to this embodiment, since the base region 109 of the current detecting lateral IGBT 10 and the emitter region 106 of the lateral IGBT 1 are electrically connected to each other, the ratio between the current 13 passing through the sense resistor 4 and the current 12 passing through the lateral IGBT 1, namely, the sense ratio, can be sufficiently increased as compared with that obtained in the conventional semiconductor device 50. Accordingly, the resistance value of the sense resistor 4 and the size of the current detecting lateral IGBT 10 can be designed to be larger, and therefore, variation in the current value at which the overcurrent protection function is exhibited can be reduced.

Figure 2:
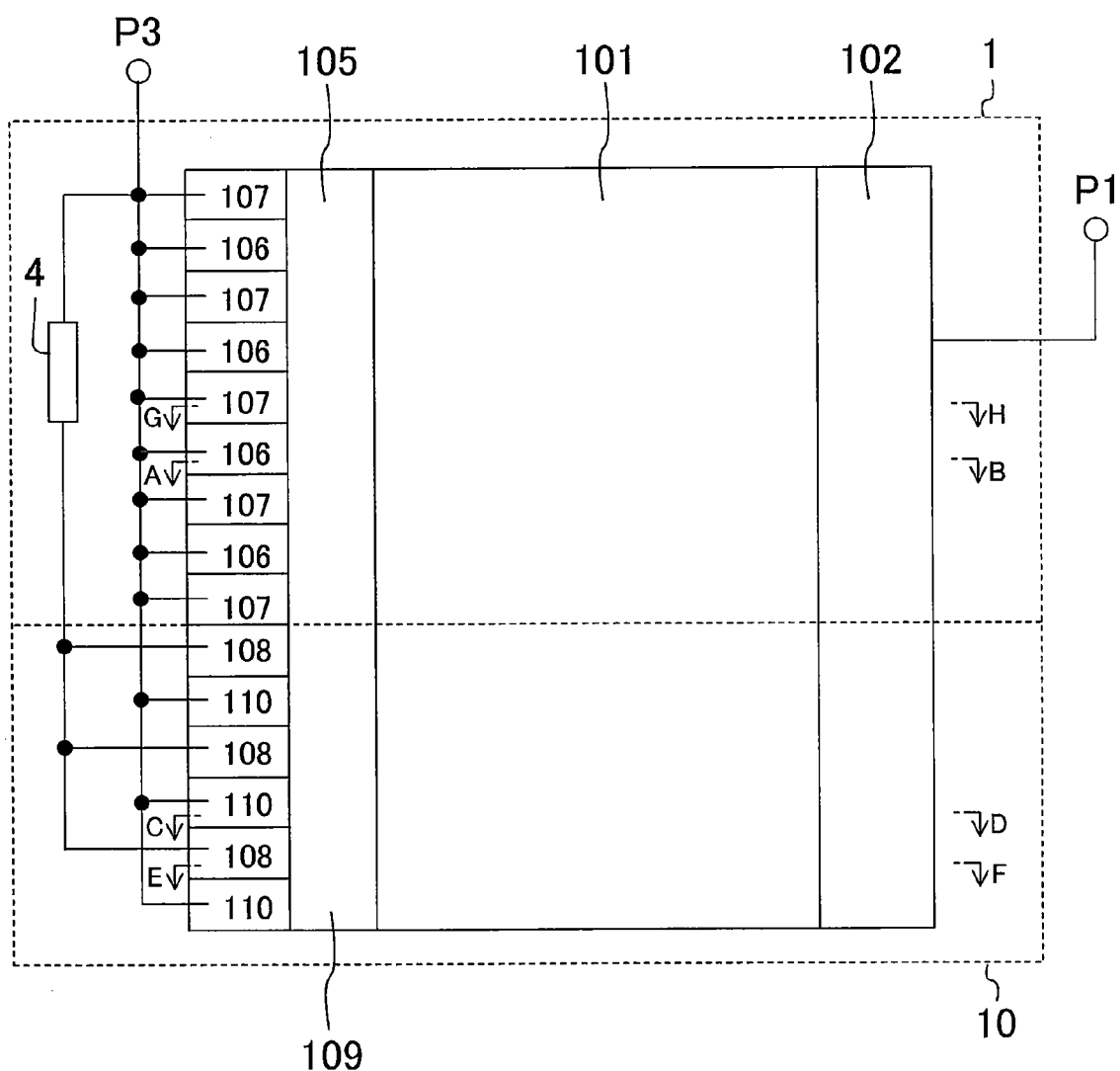
FIG. 2 is a plan view of the semiconductor device according to the embodiment of the invention.

FIG. 2 is a plan view for showing an exemplified configuration of the lateral IGBT 1 corresponding to the principal switching element and the current detecting lateral IGBT 10 connected to the lateral IGBT 1 in parallel in the semiconductor device of this embodiment. Also, FIGS. 3 through 6 are cross-sectional views thereof respectively taken on lines A-B, G-H, C-D and E-F of FIG. 2.

Figure 3:
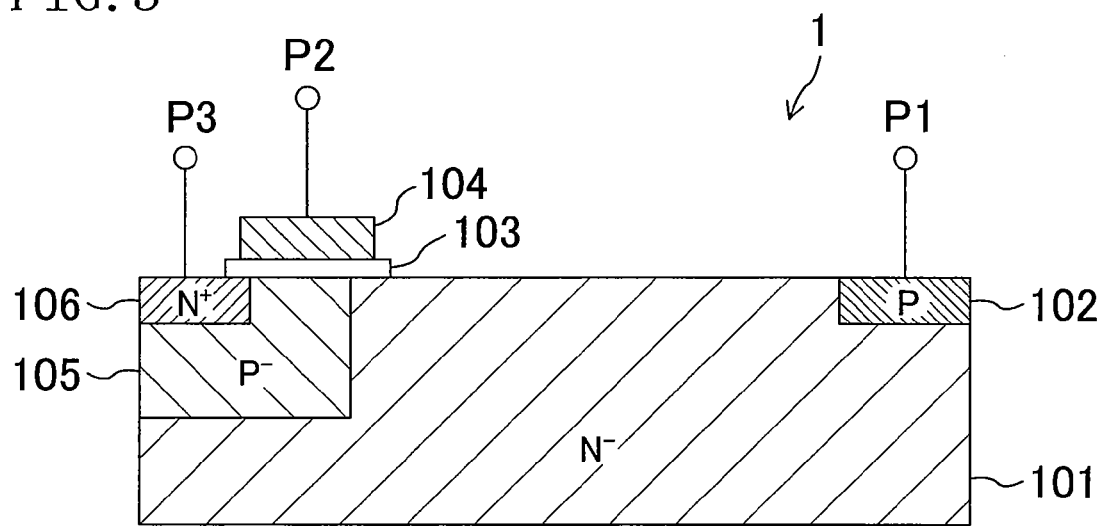
FIG. 3 is a cross-sectional view (taken on line A-B of FIG. 2) of the semiconductor device according to the embodiment of the invention.
Figure 4:
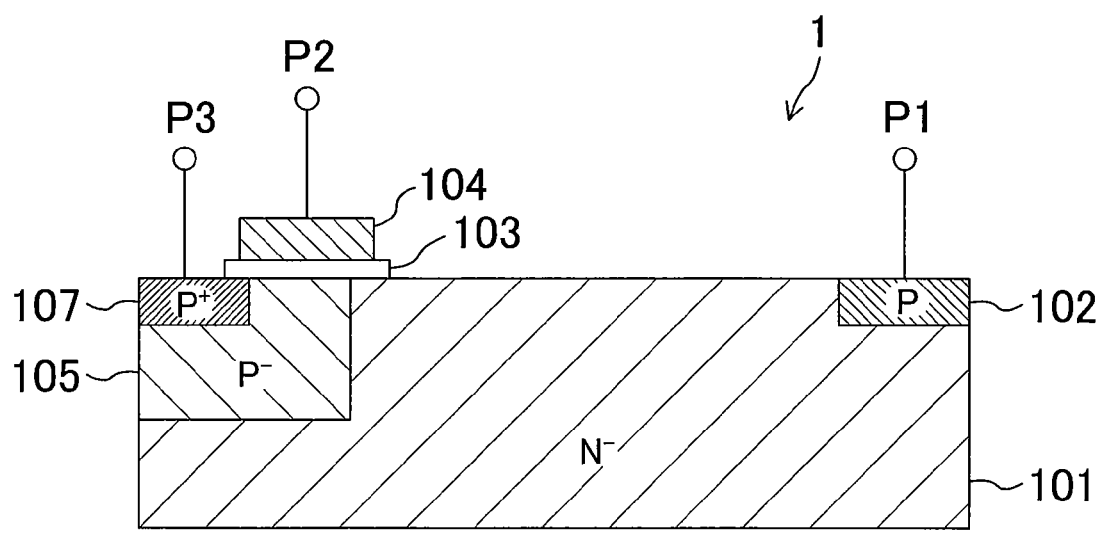
FIG. 4 is another cross-sectional view (taken on line G-H of FIG. 2) of the semiconductor device according to the embodiment of the invention.

As shown in FIGS. 2 through 4, a P$^-$-type base region 105 is formed in a surface portion of an N$^-$-type semiconductor substrate 101 in the lateral IGBT 1. An N$^+$-type emitter region 106 is formed in a surface portion of the base region 105. Also, a gate insulating film 103 is formed over the base region 105 so as to extend from a portion on the emitter region 106 to a portion on the semiconductor substrate 101, and a gate electrode 104 is formed on the gate insulating film 103. Furthermore, a P-type collector region 102 is formed in another surface portion of the semiconductor substrate 101 to be spaced from the base region 105.

At this point, in the lateral IGBT 1 of this embodiment, the emitter region 106 includes a plurality of sections spaced from one another, and these plural sections are arranged along a direction vertical to a direction extending from the collector region 102 toward the base region 105. Also, a plurality of sections of a P$^+$-type base contact region 107 are disposed among the respective sections of the emitter region 106 in the base region 105. Thus, the P$^-$-type base region 105 is electrically connected to the N$^+$-type emitter region 106 through the P$^+$-type base contact region 107.

Furthermore, a collector terminal P1 electrically connected to the collector region 102, a gate terminal P2 electrically connected to the gate electrode 104 and an emitter terminal P3 electrically connected to the emitter region 106 and the base contact region 107 are formed above the semiconductor substrate 101.

The lateral IGBT 1 shown in FIGS. 2 through 4 is turned on when a forward bias voltage is applied between the gate terminal P2 and the emitter terminal P3 with a side of the collector terminal P1 set to high potential. Alternatively, when a zero bias voltage or a backward bias voltage is applied between the gate terminal P2 and the emitter terminal P3, it is turned off. In this manner, the lateral IGBT 1 has a switching characteristic that it is turned on/off in accordance with a gate voltage applied to the gate electrode 104.

Figure 5:
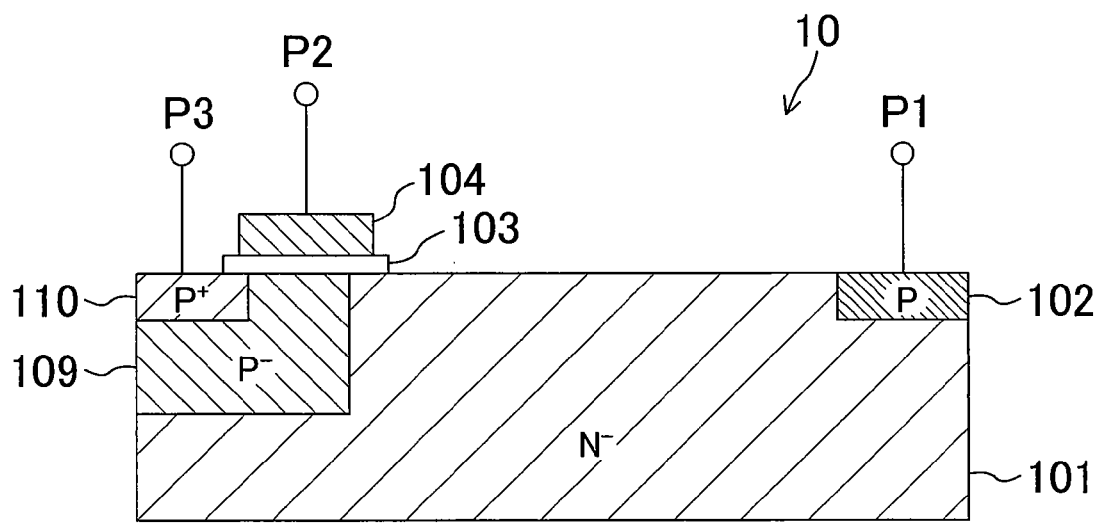
FIG. 5 is still another cross-sectional view (taken on line C-D of FIG. 2) of the semiconductor device according to the embodiment of the invention.
Figure 6:
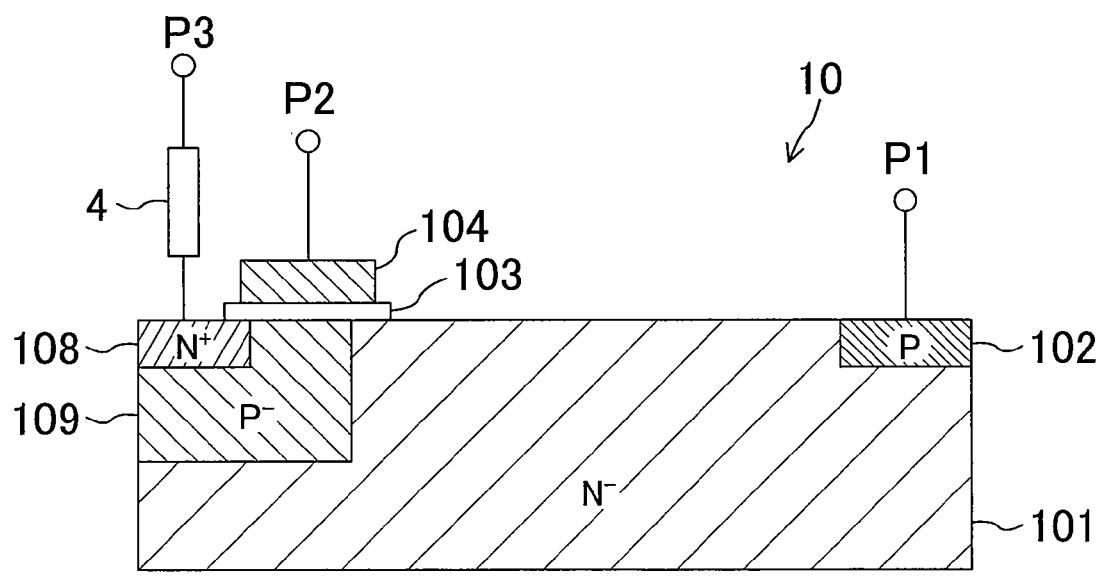
FIG. 6 is still another cross-sectional view (taken on line E-F of FIG. 2) of the semiconductor device according to the embodiment of the invention.
Figure 7:
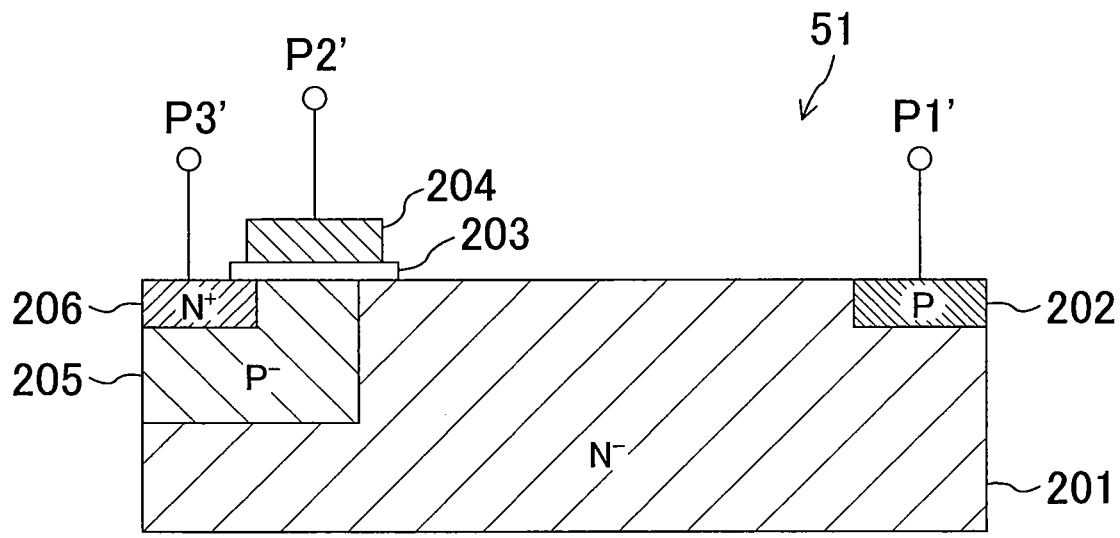
FIG. 7 is a cross-sectional view for showing the structure of a conventional lateral IGBT.

On the other hand, the current detecting lateral IGBT 10 shown in FIGS. 2, 5 and 6 is formed on the same N$^-$-type semiconductor substrate 101 as the lateral IGBT 1. Specifically, in the current detecting lateral IGBT 10, a P$^-$-type base region 109 is formed in a surface portion of the semiconductor substrate 101. An N$^+$-type emitter region 108 is formed in a surface portion of the base region 109. Also, a gate insulating film 103 is formed over the base region 109 so as to extend from a portion on the emitter region 108 to a portion on the semiconductor substrate 101, and a gate electrode 104 is formed on the gate insulating film 103. Furthermore, a P-type collector region 102 is formed in another surface portion of the semiconductor substrate 101 to be spaced from the base region 109. In other words, the gate insulating film 103, the gate electrode 104 and the collector region 102 are shared by the lateral IGBT 1 and the current detecting lateral IGBT 10.

At this point, in the current detecting lateral IGBT 10 of this embodiment, the emitter region 108 includes a plurality of sections spaced from one another, and these plural sections are arranged along a direction vertical to a direction extending from the collector region 102 toward the base region 109. Also, a plurality of sections of a P$^+$-type base contact region 110 are disposed among the respective sections of the emitter region 108 in the base region 109.

As a characteristic of this embodiment, the emitter region 108 of the current detecting lateral IGBT 10 is electrically connected to the sense resistor 4 working as a current detecting resistor. On the other hand, the base contact region 110 is electrically connected to the emitter terminal P3. As a result, the base region 109 of the current detecting lateral IGBT 10 and the emitter region 106 of the lateral IGBT 1 are electrically connected to each other through the P$^+$-type base contact region 110 in this embodiment.

Furthermore, as shown in FIGS. 2 and 6, the emitter region 108 of the current detecting lateral IGBT 10 and the emitter region 106 of the lateral IGBT 1 are electrically connected to each other through the sense resistor 4.

As described so far, since the lateral IGBT 1 corresponding to the principal switching element and the current detecting lateral IGBT 10 are formed on the same semiconductor substrate 101 in this embodiment, a structure in which the base region 109 of the current detecting IGBT 10 and the emitter region 106 of the lateral IGBT 1 are electrically connected to each other can be easily obtained as compared with the case where these IGBTs are not formed on the same substrate.

Moreover, since the lateral IGBT 1 and the current detecting lateral IGBT 10 of this embodiment are both lateral elements, the degree of freedom in the layout of electrodes and interconnects is higher than in a vertical IGBT having a surface covered with an emitter electrode. Therefore, the structure in which the base region 109 of the current detecting IGBT 10 and the emitter region 106 of the lateral IGBT 1 are electrically connected to each other can be easily obtained.

Although the lateral IGBT 1 and the current detecting lateral IGBT 10 are both lateral elements in this embodiment, these IGBTs may be fabricated as vertical elements with a base region of a current detecting vertical IGBT electrically connected to an emitter region of a vertical IGBT corresponding to the principal switching element. Also in this case, a ratio between a current passing through a detecting resistor and a current passing through the vertical IGBT corresponding to the principal switching element, namely, a sense ratio, can be increased as compared with that obtained in a conventional semiconductor device.

What is claimed is:

1. A semiconductor device comprising:
a principal IGBT controllable in accordance with a gate voltage applied to a gate electrode thereof;
a current detecting IGBT connected to the principal IGBT in parallel; and
a current detecting circuit and a current detecting resistor for detecting a current passing through the current detecting IGBT,
the principal IGBT including a first base region and a first emitter region formed in a surface portion of the first base region,
the current detecting IGBT including a second base region and a second emitter region formed in a surface portion of the second base region,
the second base region of the current detecting IGBT being connected to the first emitter region of the principal IGBT but not connected through the current detecting circuit, the current detecting resistor unit and a first collector region of the principal IGBT,
the second emitter region of the current detecting IGBT being connected to the first emitter region of the principal IGBT through the current detecting resistor.

2. The semiconductor device of claim 1, wherein the principal IGBT and the current detecting IGBT are formed on one semiconductor substrate.

3. The semiconductor device of claim 1, wherein the principal IGBT and the current detecting IGBT are lateral elements.

4. The semiconductor device of claim 1, wherein:
when an electrical current flows through the current detecting resistor, an electrical potential of the first base region, an electrical potential of the first emitter region, and an electrical potential of the second base region are substantially identical with one another, and
an electrical potential of the second emitter region is different from the electrical potential of the first emitter region.

5. The semiconductor device of claim 1, wherein:
the principal IGBT includes a first base contact region formed in a surface portion of the first base region, the first base contact region having higher impurity concentration than the first base region,
the current detecting IGBT includes a second base contact region formed in a surface portion of the second base region, the second base contact region having higher impurity concentration than the second base region, and
the second base contact region is directly connected to the first emitter region.

6. The semiconductor device of claim 5, wherein
the second base contact region is directly connected to the first base contact region.

7. The semiconductor device of claim 1, wherein:
the first emitter region of the principal IGBT includes a plurality of first emitter sections spaced from one another in a plan view, and
the first base region of the principal IGBT includes a plurality of first base contact sections having a higher impurity concentration than the first base region and spaced from one another in a plan view.

8. The semiconductor device of claim 7, wherein
the plurality of first emitter sections and the plurality of first base contact sections are disposed alternately in a plan view along a direction perpendicular to a direction extending from the first collector region of the principal IGBT toward the first base region in a plan view.

9. The semiconductor device of claim 1, wherein:
the second emitter region of the current detecting IGBT includes a plurality of second emitter sections spaced from one another in a plan view, and
the second base region of the current detecting IGBT includes a plurality of second base contact sections having a higher impurity concentration than the second base region and spaced from one another in a plan view.

10. The semiconductor device of claim 9, wherein
the plurality of second emitter sections and the plurality of second base contact sections are disposed alternately in a plan view along a direction perpendicular to a direction extending from a second collector region of the current detecting IGBT toward the second base region in a plan view.

11. The semiconductor device of claim 1, wherein the current detecting circuit includes a reference voltage source and a voltage comparator for comparing a voltage between both ends of the current detecting resistor with a reference voltage of the reference voltage source.

* * * * *